United States Patent [19]

Hahn

[11] Patent Number: 5,721,518

[45] Date of Patent: Feb. 24, 1998

[54] CANCELLATION TECHNIQUE FOR BANDPASS FILTERS USING A NARROWBAND NETWORK HAVING OPTIMALLY COUPLED AND OVERCOUPLED FILTERS

[75] Inventor: Richard M. Hahn, Cincinnati, Ohio

[73] Assignee: Xetron Corporation, Cincinnati, Ohio

[21] Appl. No.: 664,054

[22] Filed: Jun. 13, 1996

[51] Int. Cl.⁶ .................................................. H03H 7/01
[52] U.S. Cl. .................................... 333/167; 333/174
[58] Field of Search ............................ 333/167, 117, 333/126, 175

[56] References Cited

U.S. PATENT DOCUMENTS

| | | | |
|---|---|---|---|
| 2,875,283 | 2/1959 | Maione | 333/117 X |
| 3,582,839 | 6/1971 | Pim | 333/191 |
| 3,737,813 | 6/1973 | Buecherl | 333/167 |
| 4,396,893 | 8/1983 | Edson | 33/175 X |

FOREIGN PATENT DOCUMENTS 983079  6/1951  France ........................... 333/167

OTHER PUBLICATIONS

Graf, *Modern Dictionary of Electronics*, p. 700 1988.

*Primary Examiner*—Robert Pascal
*Assistant Examiner*—Justin P. Bettendorf
*Attorney, Agent, or Firm*—Walter G. Sutcliff

[57] ABSTRACT

A bandpass filter network having a first two pole filter and a second two pole filter provided in parallel to the first two pole filter. The first filter is optimally coupled while the second filter is extremely overcoupled. Moreover, the first filter and second filter are shifted 180° out of phase with one another. This phase shift is preferably accomplished by a balun transformer. Alternatively, the 180° phase shift may be accomplished by having the first and second filters utilizing different forms of coupling (i.e., one inductively coupled, the other capacitively coupled).

5 Claims, 6 Drawing Sheets

CANCELLATION TECHNIQUE FOR BANDPASS FILTERS USING A NARROWBAND NETWORK HAVING OPTIMALLY COUPLED AND OVERCOUPLED FILTERS

BACKGROUND OF THE INVENTION

1. Field of the Invention

The present invention relates generally to frequency selectable filters, such as bandpass filters, and more particularly to such filters which utilize a narrow band parallel network to improve the close-in selectivity of the filter.

2. Description of the Prior Art

There are a number of types of frequency selective filters. One type of frequency selective filter is a bandpass filter. A bandpass filter is a filter whose passband is from some frequency $w_{p1}$ to frequency $w_{p2}$ and whose stopbands are from zero to $w_{s1}$ and from $w_{s2}$ to infinity where $w_{s1}$ is $<w_{p1}<w_2<w_{s2}$.

Bandpass filters have been utilized in countless applications. For instance, bandpass filters may be utilized in instances where numerous data signals at different frequencies are superimposed on a single line. In particular, the individual data signals may be separated through a plurality of bandpass filters and subsequently directed to appropriate receivers. The selectivity of the particular frequency selective filter may be defined as the ability of the frequency selective filter to pass signals within one frequency range and reject all others. Many bandpass filter applications seek to attain a specific attenuation level at a minimum frequency offset from the center frequency and do not require increasing selectivity with increasing frequency offset.

The ideal bandpass filter has no bandpass insertion loss and has infinite stopband selectivity. Presently, a number of methods have been utilized to increase the close-in selectivity of non-ideal bandpass filters. The standard methods includes increasing the filter loaded Q, by adding tuned circuits (i.e., increasing the number of poles), adding transmission zeros (utilizing an elliptic design), or by cascading two or more filters.

While these presently known methods increase the selectivity of bandpass filters, they have the disadvantages of altering passband performance either by increasing insertion loss and/or reducing the usable bandwidth of the passband of the filter. Furthermore, the present methods of increasing the close-in selectivity result in the utilization of additional parts, increased filter/system complexity and increased filter tune-up time.

Referring to FIG. 1, a block schematic depiction of a typical filter system 10 previously known in the industry is shown. A circuit diagrammatic of such a typical known filter 10 is shown in FIG. 2.

Referring to FIG. 2, a first Lr/Cr combination 22 is made of a first inductor (Lr1) 24 and a first capacitor (Cr1) 26 in parallel. A second Lr/Cr combination 28 is made of a second inductor (Lr2) 30 and a second capacitor (Cr2) 32 in parallel. Each Lr/Cr combination 22, 28 makes up a tuned circuit (filter pole). The filter poles 22, 28 are operatively connected through a coupling inductor 12. The coupling inductor can be any suitable type such as, for example, capacitive, magnetic, shunt capacitive or shunt inductive. The additional inductors 14 (they could also be capacitors, transformers, etc.) determine the characteristics of the filter response.

Filters generally operate by providing an impedance match to signals within the passband and an impedance mismatch to signals outside the passband (i.e., the "stopband"). The amount of mismatch which occurs at a specific stopband frequency determines how much of the signal is reflected and how much residual is transmitted through the filter. The greater the mismatch, the more selectivity the filter provides. Typically, this mismatch is increased (in order to increase the filter's selectivity) by adding additional tuned circuits into a standard filter design. As noted, this approach can increase the insertion loss.

Therefore, it is desirable to provide a bandpass filter with improved close-in selectivity and reduced passband insertion loss without increasing the stopband impedance mismatch.

SUMMARY OF THE INVENTION

A cancellation technique for bandpass filters is provided which makes it possible to obtain improvement in close-in selectivity and passband insertion loss over the standard design by using additional tuned circuits. The present technique operates such that it does not increase the stopband impedance mismatch, but instead provides a secondary transmission path "around" the first filter which allows the residual stopband signals going through each filter to cancel after being recombined at the outputs.

By redistributing the total number of tuned circuits into two separate filters which are placed in parallel, an improvement in both close-in selectivity and insertion loss can be obtained over the standard design using the same total number of tuned circuits. Additionally, each of these filters can be aligned independent of the other allowing for less complex tuning adjustment. Thus, two separate two-pole filters (i.e., filters having an even number of poles) are provided in a parallel configuration. The preferred network utilizes a second 2-pole filter which is designed to be extremely over-coupled.

A fixed 180° phase shift block element is necessary when the design of the two filters use identical forms of coupling (i.e., inductive, capacitive, etc.), but is not required if the means of coupling are different (e.g., if one of the filters has inductive coupling and the other has capacitive coupling) since this in itself would generate the required 180° phase inversion. For a fixed tuned design, implementing the 180° phase shift is relatively simple and can be accomplished in a number of ways including a length of coaxial cable which is 180° at center frequency, a 180° balun transformer or by using a different type of coupling element (capacitive for example).

For tunable filters, a variable phase shift network such as through the use of varactors or switched lengths of coaxial line may be used. It is preferred that when varactor tuned filters are used, a balun transformer arrangement be used to accomplish the phase inversion.

Other objects and advantages of the invention will become apparent from a description of certain present preferred embodiments thereof shown in the drawings.

DETAILED DESCRIPTION OF THE PREFERRED EMBODIMENTS

Figure 3:
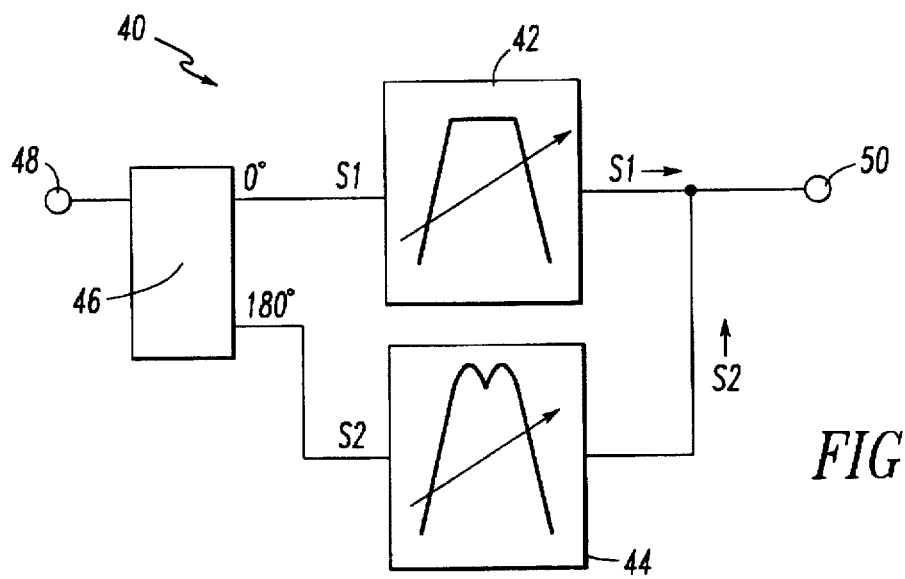
FIG. 3 is a block diagrammatic view of the present 2 pole/2 pole preferred filter scheme.
Figure 4:
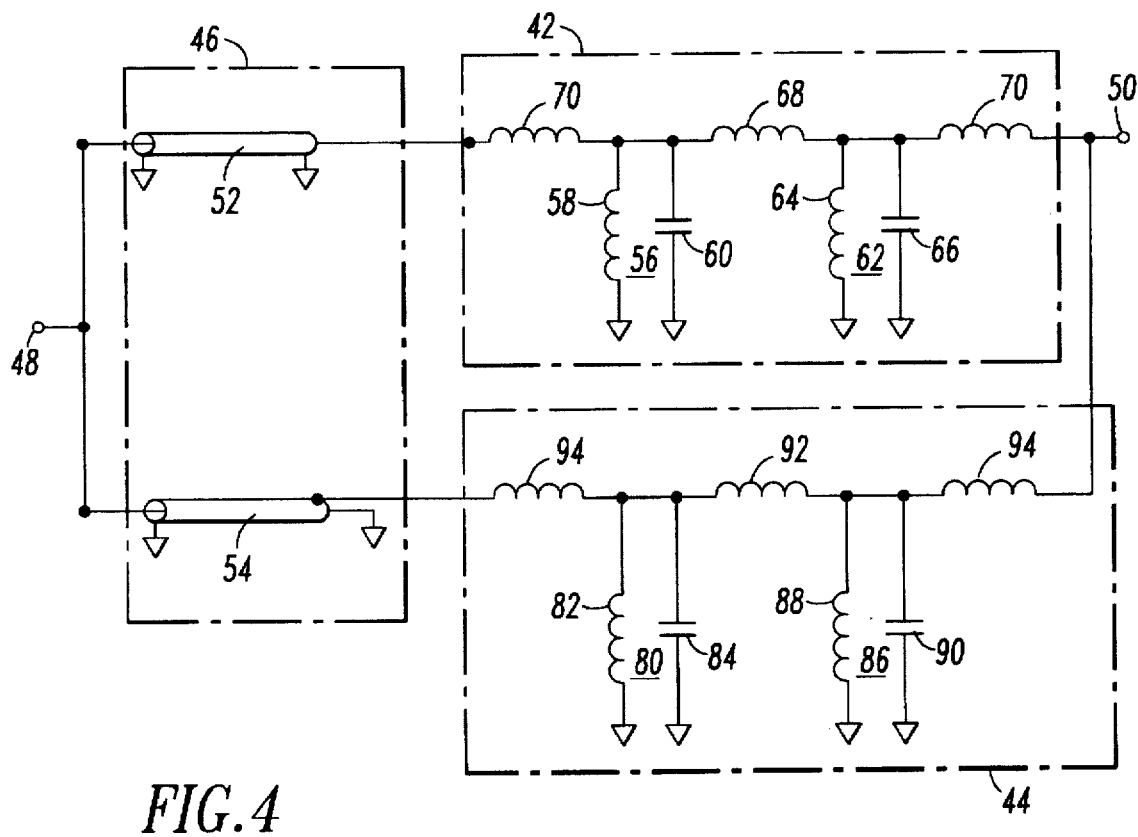
FIG. 4 is a circuit diagrammatic view of a preferred embodiment of the present 2 pole/2 pole filter system.

Referring first to FIGS. 3 and 4, a description of the preferred network is provided. FIG. 3 shows a schematic of the preferred 2 pole/2 pole bandpass filter system. A first bandpass filter 42 is provided in parallel with a second bandpass filter 44. A phase shift 46 is designed into the system Thus, a signal applied at the RF input 48 is split and one half of the signal, S1, travels through the first bandpass filter 42. A second signal portion, S2, is shifted in phase 180° relative to the first signal portion S1 and travels through the second bandpass filter 44. The first and second signal portions S1, S2 are recombined at the RF output 50.

FIG. 4 shows a circuit diagrammatic for the preferred 2 pole/2 pole system. The preferred filter system is a standard all-pole design except that the input has a 180° phase shift network 46.

The 180° phase inversion 46 may be accomplished in any convenient manner, but is preferably accomplished by using two short lengths (approximately 1.2 inches) of 50Ω coaxial transmission line in a balun arrangement.

As shown in FIG. 4, a signal is entered at the RF input 48. The signal is split into a first signal portion S1 and a second signal portion S2. The first signal portion S1 travels through a first section of transmission line 52. The signal portion S1 then travels into the first bandpass filter 42.

Figure 1:
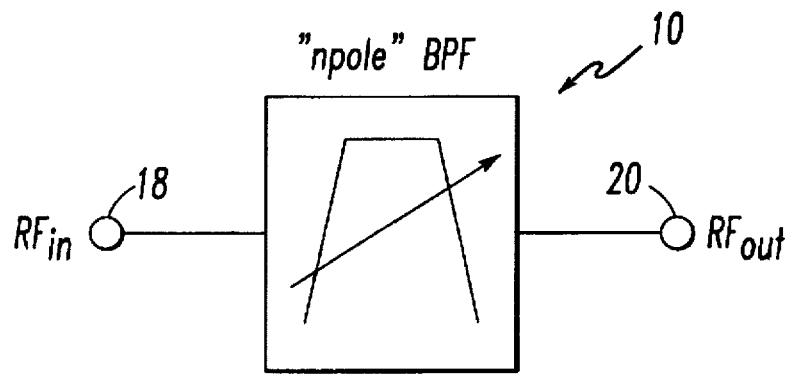
FIG. 1 is a schematic view of a prior art filter scheme.
Figure 2:
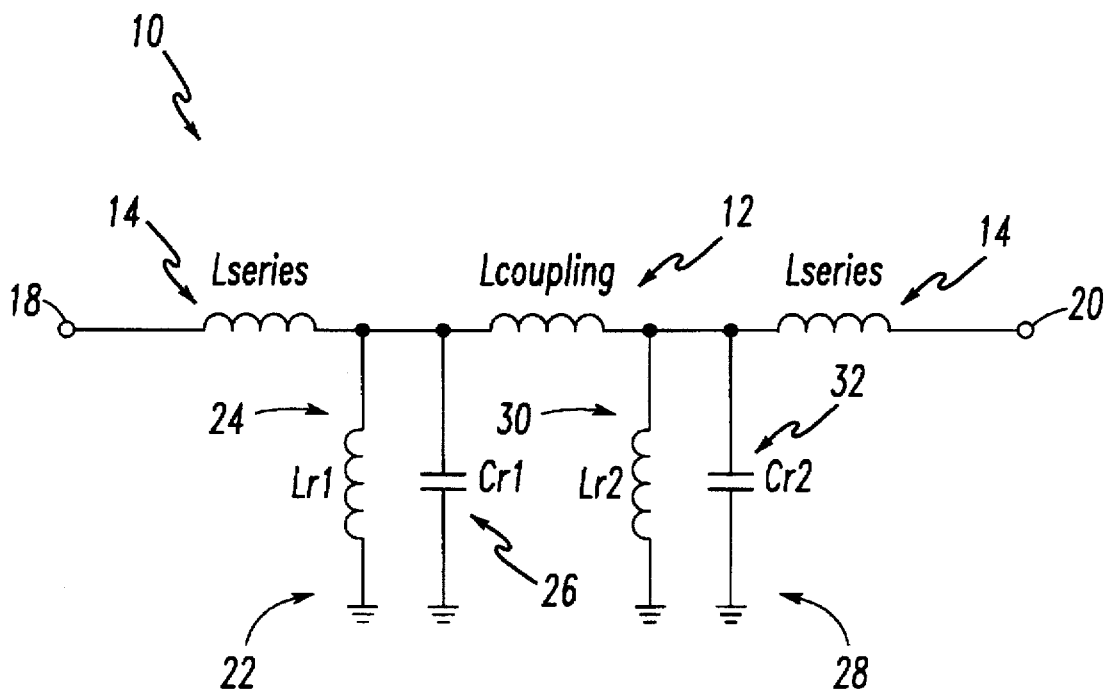
FIG. 2 is a circuit diagrammatic view of a prior two pole bandpass filter.

The first bandpass filter 42 is similar to the typical filter systems known in the prior art (see FIGS. 1 and 2). The first bandpass filter 42 is optimally coupled. The first bandpass filter 42 has a first Lr/Cr combination 56 made of a first inductor 58 and a first capacitor 60 in parallel. A second Lr/Cr combination 62 is made of a second inductor 64 and a second capacitor 66 in parallel. Each Lr/Cr combination 56, 62 makes up a tuned circuit (filter pole) for the first bandpass filter 42. The two filter poles 56, 62 are operatively connected through inductive coupling 68. Additional inductors 70 (which could also be capacitors, transformers, etc.) determine the characteristics of the filter response.

The second signal portion S2 travels through a second section of transmission line 54. The second section of transmission line 54 is sized and designed so as to impose a phase shift upon the second signal portion S2, such that the second signal portion S2 is shifted in phase 180° relative to the first signal portion S1. The second signal portion S2 then travels into the second bandpass filter 44. The second bandpass filter 44 is also similar in general design to the prior art filters described with reference to FIGS. 1 and 2.

However, the second bandpass filter 44 is extremely "overcoupled". In general terms, an optimally coupled filter yields a low (i.e., generally flat top response) passband ripple (<1 dB), where an "overcoupled" filter yields a high passband ripple (>1 dB). The coupling inductor is approximately 30% smaller than the optimally coupled filter. This corresponds approximately to a 6 dB Ripple Chebyshev response.

The second bandpass filter 44 has a first Lr/Cr combination 80 made of a first inductor 82 and a first capacitor 84 in parallel. A second Lr/Cr combination 86 is made of a second inductor 88 and a second capacitor 90 in parallel. Each Lr/Cr combination 80, 86 makes up a tuned circuit (filter pole) for the second bandpass filter 44. The two filter poles 80, 86 are operatively connected through inductive coupling 92. Additional inductors 94 (which could also be capacitors, transformers, etc.) determine the characteristics of the filter response.

As noted above, the 180° difference in phase between the first signal portion S1 and the second signal portion S2 is preferably accomplished by a balun transformer built using the first section of transmission line 52 and the second section of transmission line 54.

The additional coupling network provides an adjustable low loss, broad band transmission path through a second bandpass filter 44 around the first bandpass filter 42 which when recombined with the normal transmission path through the first bandpass filter 42 causes signal cancellation to occur at some frequency or frequencies (DF). The exact DF where the cancellation occurs is where the attenuation through the cancellation network along the coupled inductors is equal to the attenuation through the filter by itself. Thus, it is apparent that if the two "n/2 pole" filters 42, 44 are exactly the same, then the first signal portion (S1) coming out of the first bandpass filter 42 will be equal in amplitude but 180° out of phase with the second signal portion (S2) out of the second bandpass filter 44. Furthermore, upon recombination at the RFout port 50, the two signal portions (S1 and S2) will cancel entirely, allowing no signals to pass through the system. This outcome is desirable in the stopband, but not in the passband where signal loss is to be minimized. It is therefore necessary to alter the passband transmission amplitude and/or phase response of the second bandpass filter 44 such that at the recombination point, cancellation effects in the passband are minimized.

Figure 5:
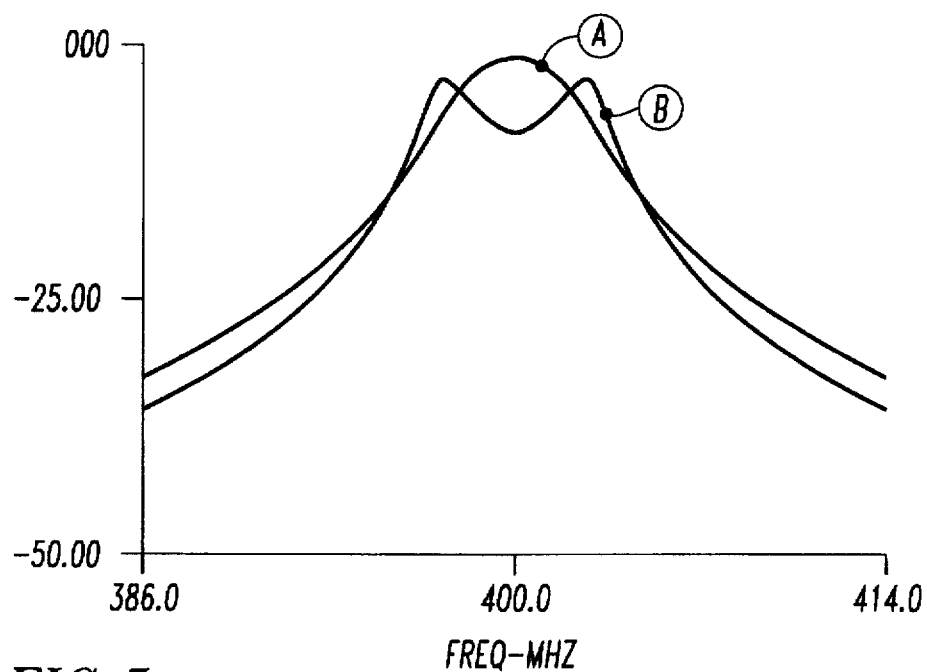
FIG. 5 is a diagrammatic view showing the plots of a Butterworth transmission amplitude response and of an overcoupled transmission amplitude response.

FIG. 5 shows two different 2 pole bandpass filter transmission responses tuned to a center frequency of 400 MHz which were based on a computer model of the basic 2 pole schematic. Plot A is a typical Butterworth or low ripple Chebychev response showing low passband loss (insertion loss) and selectivity which increases with offset from center frequency at approximately 12 dB/octave. Plot B, however, shows an extremely "overcoupled" response which has selectivity similar to Plot A, but exhibits two distinct peaks as well as high insertion loss (approximately 9 dB in the trough of the curve at 400 MHz). The only difference in the schematics for these two filters is in component values for several elements (Lseries and Lcoupling).

Figure 6:
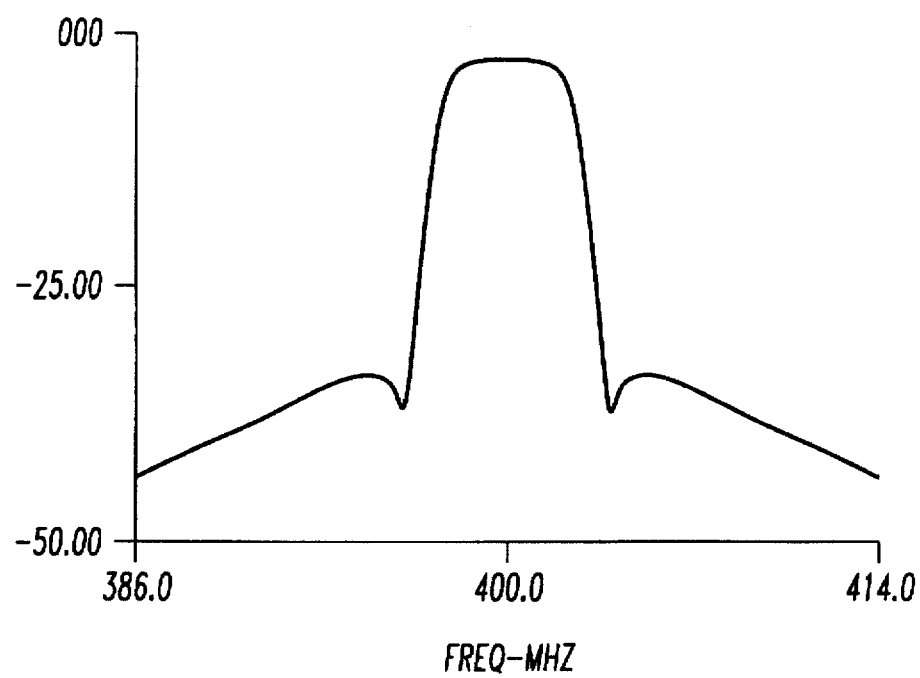
FIG. 6 is a diagrammatic view showing the transmission amplitude response of the combined 2 pole/2 pole responses of FIG. 5.

Using the filter corresponding to Plot A from FIG. 5 for the first bandpass filter 42 (of FIG. 3) and the filter corresponding to Plot B from FIG. 5 for the second bandpass filter 44 (of FIG. 3), the resulting transmission amplitude response to the combined system is as shown in FIG. 6.

In modeling the combined 2 pole/2 pole, an N=1 inverting transformer was used to provide the 180° phase shift 46. Two items to note in FIG. 5 are the extremely steep selectivity slope on either side of the passband (out to about +/– 4 MHz removed from the center frequency) and that the insertion loss has not increased much above that obtained in the single 2 pole (see Plot A of FIG. 5).

Figure 7:
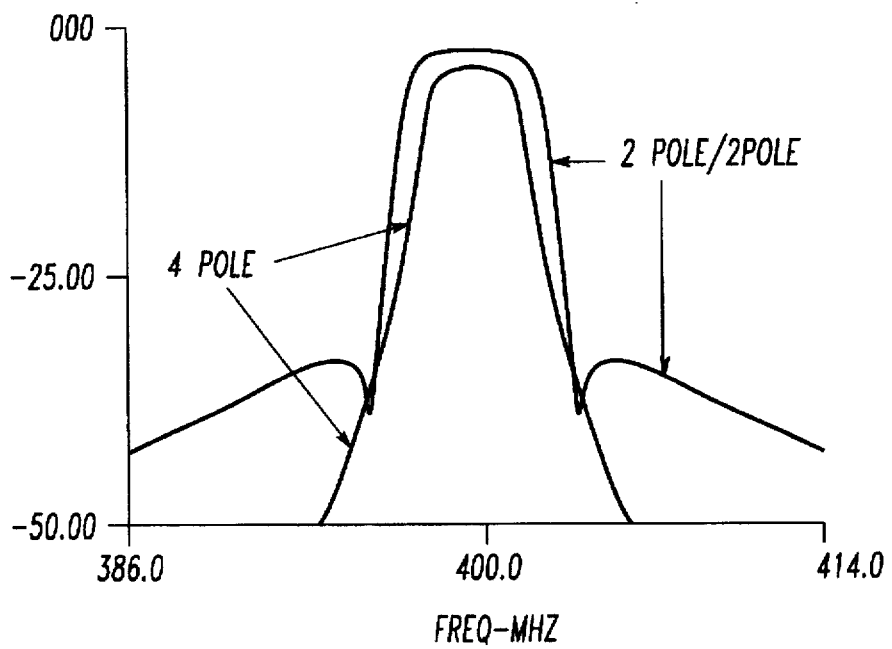
FIG. 7 is a diagrammatic view showing the transmission amplitude response of the present preferred 2 pole/2 pole filter system compared to the transmission amplitude response of the standard design 4 pole system.
Figure 8:
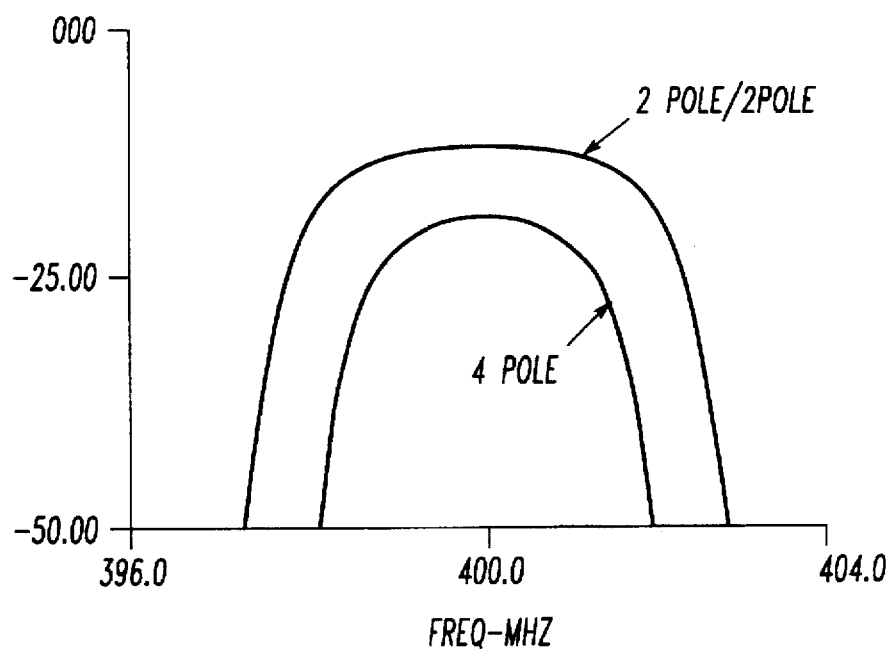
FIG. 8 is a diagrammatic view showing the insertion loss of the standard design 4 pole system.

In FIG. 7 the combined 2 pole/2 pole response is compared with a standard design-4 pole-0.1 dB Chebychev response which was designed to attain the same selectivity at +/– 4 MHz from center frequency (approximately 30 dB). Note that the combined 2 pole/2 pole response has significantly lower insertion loss than the standard 4 pole design (see FIG. 8). It is important to note that the key in comparing the 4 pole design and the 2 pole/2 pole network is that the same tuned circuits have been used to make up each filter (that is the same values for Lr, Cr, and unloaded Q have been in use in every tuned circuit).

Figure 9:
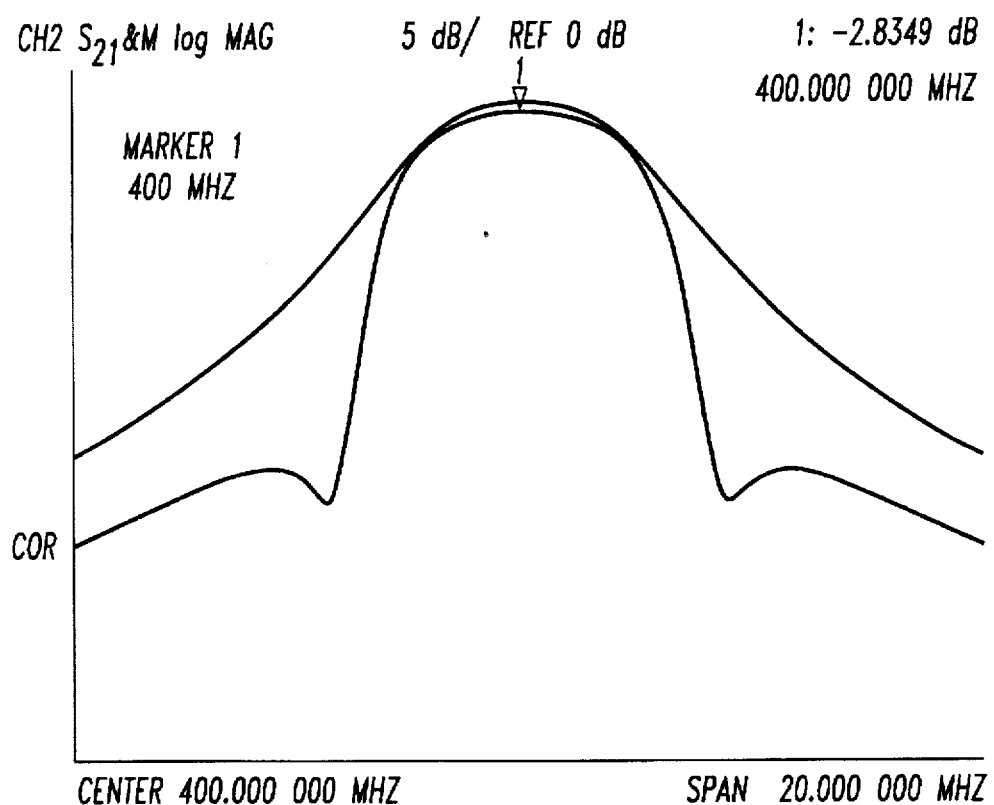
FIG. 9 is a diagrammatic view showing the transmission amplitude response of the present preferred 2 pole/2 pole system compared to the transmission amplitude response of the nonovercoupled bandpass filter.

FIG. 9 shows the transmission amplitude responses of the main 2 pole filter (the "overcoupled" filter's response is not shown) and that of the combined system. Note only a slight increase in passband insertion loss (the 2 pole has about 2.13 dB loss and the combined system has 2.83 dB loss) and that the combined system has attained better than 25 dB selectivity at +/–4 MHz removed from the center frequency (400 MHz).

Figure 10:
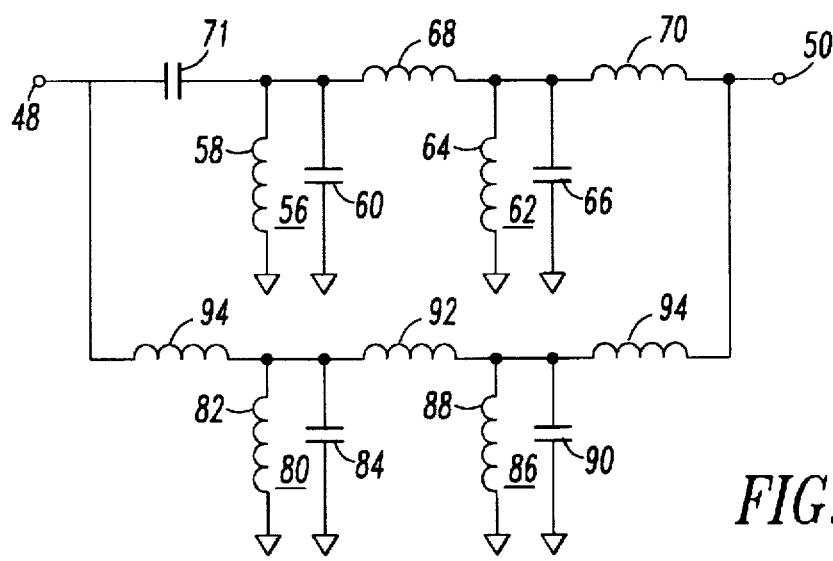
FIG. 10 is a circuit diagrammatic view of an alternative embodiment of the present preferred filter system.

Variations of the preferred embodiments may be made. For example, referring again to FIG. 4, the 180° phase shift required for the combined filter system was accomplished by using 180° balun made up of 2 separate transmission lines, one 2 pole connected to the center conductor of one "T-line" and the other 2 pole connected to the shield of the other. Since the two filters shown in FIG. 4 have all inductive coupling, the transmission phase responses, out of the passband, will be identical. For the system to work properly, a 180° phase shift is needed. A separate circuit is used to accomplish this. Using the same type of coupling elements can sometimes be necessary, particularly if a filter (or filter system) is intended to be tunable over some frequency range. For a filter system which is fixed tuned (i.e., not tunable) the desired phase shift can be accomplished simply be allowing the coupling method(s) for one of the filters to provide the desired phase shift. For example, if one of the series inductors in FIG. 4 is changed to a capacitor 71 (change one of the two L-series inductors to a capacitor which has the same reactance at 400 MHz) then the extra phase shift network is not required and the two filters are simply connected at their inputs (see FIG. 10). The system of FIG. 10 is otherwise similar to the system of FIG. 4, in which like elements are labeled with like numerals.

Figure 11:
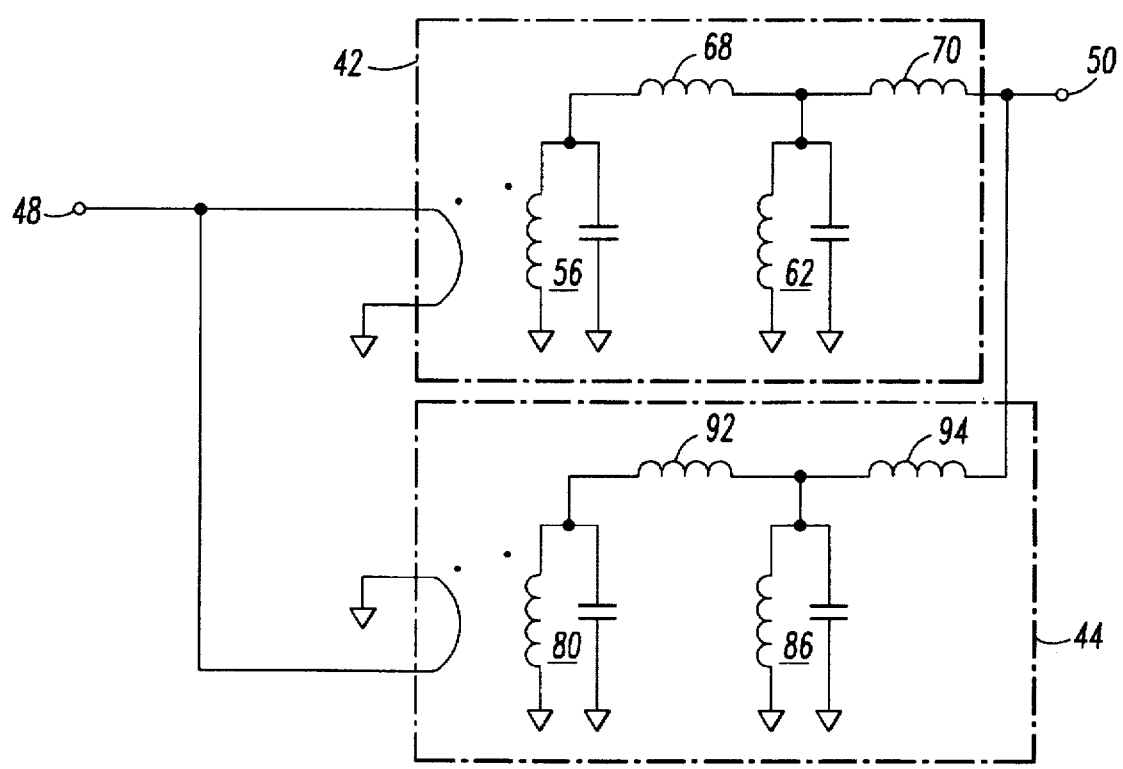
FIG. 11 illustrates an alternative method of achieving a 180° phase shift, using loop couplings.

Another alternative method for achieving the 180° phase shift would be where "loop" coupling is being used into and out of the filters. By simply physically orienting one of the loops the reverse of that of the other filter, this will provide the necessary phase shift. Such a loop coupled system is shown in FIG. 11. The system of FIG. 11 is otherwise similar to the system of FIG. 4, in which like elements are labeled with like numerals.

While certain present preferred embodiments have been shown and described, it is distinctly understood that the invention is not limited thereto but may be otherwise embodied within the scope of the following claims.

I claim:

1. A bandpass filter network comprising:

a first two-pole filter;

a second two-pole filter provided in parallel to the first two-pole filter, wherein the first filter is optimally coupled and the second filter is overcoupled an input for receiving an input rf signal;

means for shifting the phase of said input signal by 180°;

means for applying said input signal to said first filter to derive an output signal therefrom;

means for applying said 180° phase shifted signal to said second filter to derive an output signal therefrom; and means for combining the output signals of said first and second filters.

2. The bandpass filter network of claim 1 wherein the first filter has an identical form of coupling as the second filter.

3. The bandpass filter network of claim 2 wherein the first filter and second filter utilize an inductive form of coupling.

4. The bandpass filter network of claim 1 wherein said means for shifting the phase of said input signal by 180° is a balun transformer.

5. The bandpass filter network of claim 1 wherein one of the first filter and the second filter utilizes an inductive form of coupling and the other of the first filter and the second filter utilizes a capacitive form of coupling.

* * * * *